(12) United States Patent
Goss et al.

(10) Patent No.: US 8,923,045 B2
(45) Date of Patent: Dec. 30, 2014

(54) MULTI-LEVEL CELL (MLC) UPDATE WITH PROTECTED MODE CAPABILITY

(75) Inventors: Ryan James Goss, Prior Lake, MN (US); Mark Allen Gaertner, Vadnais Heights, MN (US); David Scott Seekins, Shakopee, MN (US)

(73) Assignee: Seagate technology LLC, Cupertino, CA (US)

(*) Notice: Subject to any disclaimer, the term of this patent is extended or adjusted under 35 U.S.C. 154(b) by 394 days.

(21) Appl. No.: 13/485,503

(22) Filed: May 31, 2012

(65) Prior Publication Data

US 2013/0322169 A1 Dec. 5, 2013

(51) Int. Cl.
*G11C 11/34* (2006.01)
*G11C 16/04* (2006.01)
*G11C 16/06* (2006.01)
*G06F 12/00* (2006.01)
*G06F 12/06* (2006.01)

(52) U.S. Cl.
CPC ............... *G11C 16/06* (2013.01); *G06F 12/00* (2013.01); *G11C 11/34* (2013.01); *G11C 16/04* (2013.01); *G06F 12/06* (2013.01)
USPC ................. 365/185.02; 365/185.03; 711/103; 711/217; 711/E12.008

(58) Field of Classification Search
CPC ........ G11C 16/04; G11C 16/06; G11C 11/34; G11C 2211/561; G06F 12/00; G06F 12/06
USPC .............. 365/185.02, 185.03; 711/103, 217, 711/E12.008
See application file for complete search history.

(56) References Cited

U.S. PATENT DOCUMENTS

| | | | |
|---|---|---|---|
| 6,988,175 B2 | 1/2006 | Lasser | |
| 7,275,140 B2 | 9/2007 | Paley | |
| 7,970,981 B2 * | 6/2011 | Cheon et al. | 711/103 |
| 8,078,794 B2 * | 12/2011 | Lee et al. | 711/103 |
| 8,126,939 B2 | 2/2012 | Raciborski et al. | |
| 8,380,915 B2 * | 2/2013 | Wood et al. | 711/100 |
| 8,760,921 B2 * | 6/2014 | Kawase et al. | 365/185.09 |
| 2011/0093650 A1 | 4/2011 | Kwon et al. | |
| 2011/0202710 A1 | 8/2011 | Zhao et al. | |
| 2011/0228601 A1 | 9/2011 | Olbrich et al. | |
| 2012/0005415 A1 * | 1/2012 | Jung et al. | 711/103 |

* cited by examiner

*Primary Examiner* — Toan Le
(74) *Attorney, Agent, or Firm* — Hall Estill Attorneys at Law

(57) ABSTRACT

Method and apparatus for managing data in a memory, such as a flash memory array. In accordance with some embodiments, a first block of data is written to a group of memory cells at a first memory location in single-level cell (SLC) mode. The first block of data is copied from the first memory location to a group of memory cells at a second memory location to provide a backup copy of the first block of data during a protected mode of operation. A second block of data is subsequently overwritten to the group of memory cells at the first memory location so that the first memory location stores both the first and second blocks of data in multi-level cell (MLC) mode.

20 Claims, 5 Drawing Sheets

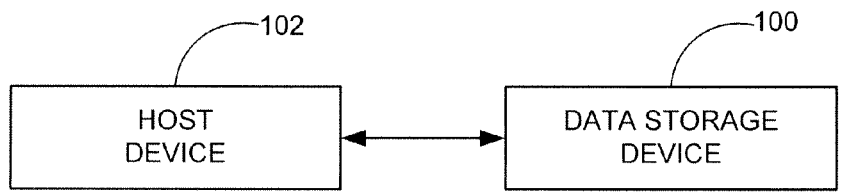
FIG. 1
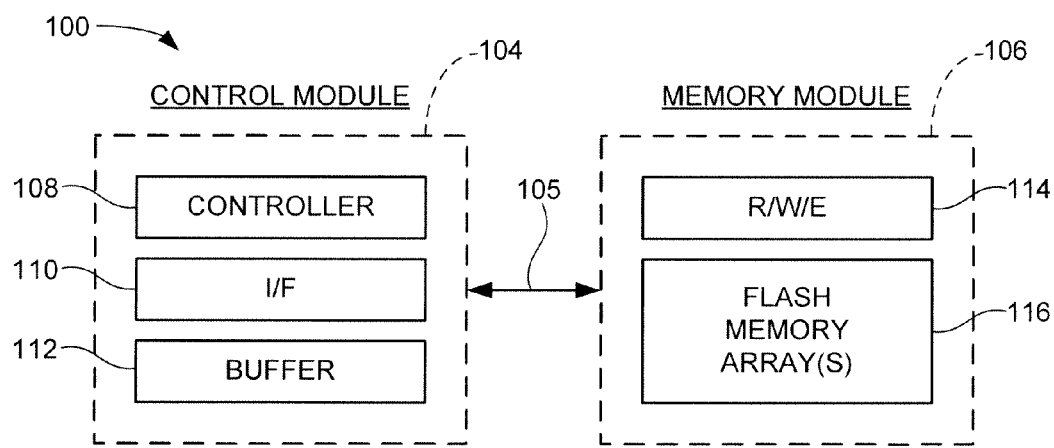
FIG. 2
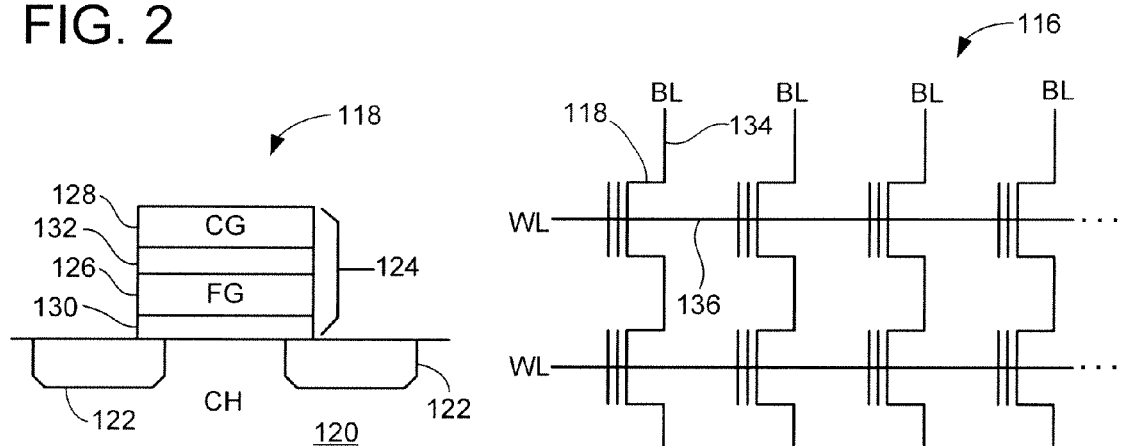
FIG. 3
FIG. 4

MULTI-LEVEL CELL (MLC) UPDATE WITH PROTECTED MODE CAPABILITY

SUMMARY

Various embodiments of the present disclosure are generally directed to the management of data in a memory, such as but not limited to a flash memory array.

In accordance with some embodiments, a first block of data is written to a group of memory cells at a first memory location in single-level cell (SLC) mode. The first block of data is copied from the first memory location to a group of memory cells at a second memory location to provide a backup copy of the first block of data during a protected mode of operation. A second block of data is subsequently overwritten to the group of memory cells at the first memory location so that the first memory location stores both the first and second blocks of data in multi-level cell (MLC) mode.

These and other features which may characterize various embodiments can be understood in view of the following detailed discussion and the accompanying drawings.

BRIEF DESCRIPTION OF THE DRAWINGS

FIG. 1 provides a functional block representation of a data storage device arranged to communicate with a host device in accordance with various embodiments.

FIG. 2 shows a block diagram representation of the data storage device of FIG. 1 in accordance with some embodiments.

FIG. 3 shows a flash memory cell construction that can be used in the device of FIG. 1.

FIG. 4 is a schematic depiction of a portion of a flash memory array using the cells of FIG. 3.

DETAILED DESCRIPTION

Figure 5:
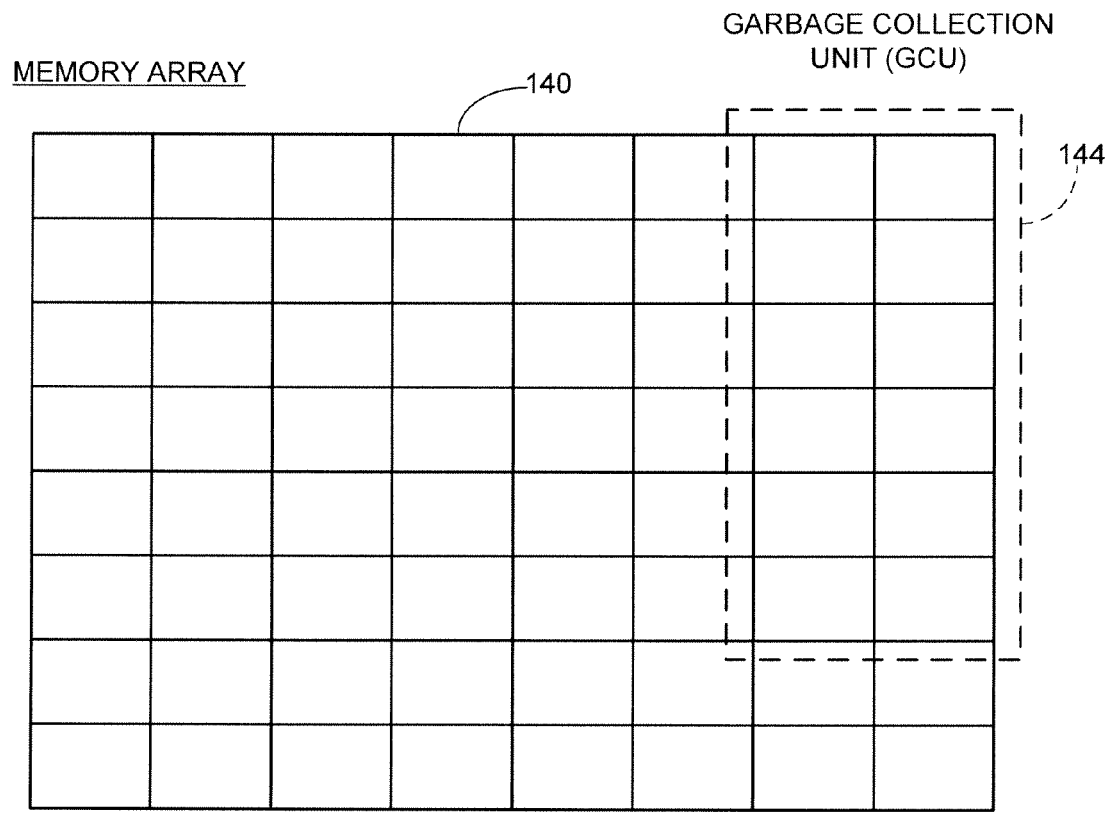
FIG. 5 illustrates an exemplary format for the flash memory array as an arrangement of erasure blocks.

The present disclosure generally relates to managing data stored in a memory module, such as but not limited to a flash memory array of a data storage device.

A wide variety of data storage memories are known in the art. Some memories take the form of solid-state memory cells which store data in relation to an amount of accumulated charge on a floating gate structure, such as with flash memory. Flash memory cells may be configured as single-level cells (SLCs) so that each cell stores a single bit (e.g., a logical 0 or 1), or as multi-level cells (MLCs) so that each cell stores multiple bits (two bits or more).

It is common in some memory arrays to store different data blocks across the same group of MLCs. In such case, the least significant bits (LSBs) in the cells along the row can represent the first block of data, and the most significant bits (MSBs) in the cells along the row can represent the second block of data.

The use of MLCs to store bits from different blocks (pages) of data in this manner can be operable to increase data capacity and decrease overhead processing requirements for a device. However, the overwriting of data to cells that currently store an existing data set can inadvertently lead to a loss of the currently stored data, particularly when an error event such as a voltage fluctuation or loss of power occurs during the overwrite event.

Accordingly, various embodiments of the present disclosure are generally directed to an apparatus and method for protecting currently stored data in a multi-bit environment. As explained below, a first data block is written to a first memory location so that the data are stored to a group of memory cells in a single level mode.

When a second block of data is presented for writing to the first memory location, the first data block is copied to a second memory location to provide a backup copy of the data. The second block of data is thereafter overwritten to the first memory location so that the memory cells store both the first and second data blocks in a multi-level mode.

A read-verify operation can be carried out to verify the first memory location correctly stores both data blocks. If an error occurred during the overwrite operation, the backup copy of the first block can be retrieved and the first and second data blocks can be rewritten, such as to a third location.

These and other features of various embodiments can be understood beginning with a review of FIG. 1, which provides a simplified block diagram of a data handling system featuring a data storage device 100 coupled to a host device 102. The respective storage device 100 and host 102 can take any suitable form. In some embodiments, the host 102 is a network accessible computing device, such as a desktop computer, a server, a portable electronic device, a smart phone, laptop, tablet, a gaming system, etc. The storage device 100 may be incorporated into the host 102, or may be connected to the host locally or via a network to provide volatile and/or non-volatile memory data storage capabilities for the host 102.

FIG. 2 illustrates an exemplary construction for the storage device 102 of FIG. 1 in accordance with some embodiments. The device 102 includes a control module 104 and a memory module 106. The control module 104 provides top level control for the data handling system, and the memory module 106 provides a main data store. The memory module 106 is adapted to receive, process and execute commands issued to it by the control module 104 across a control/memory module communication interface 105.

The respective modules 104, 106 may take a number of forms. A solid-state drive (SSD) application may incorporate both the control module 104 and the memory module 106 in an integrated, stand-alone assembly. In a hybrid disc drive application, the memory module 106 may include both flash and disc-based memory. A memory card application may incorporate some or all of the control module functionality in the host device 102 (FIG. 1).

The exemplary control module 104 in FIG. 2 is shown to include a controller 108, an interface (I/F) circuit 110 and a memory buffer 112. The controller 108 provides overall control functions for the device 100, including directing transfers of data between the host 102 and the memory module 106.

The I/F circuit 108 provides interface communications with the host and with the memory module 106. The buffer 112 can provide a storage location for programming and control data used by the controller 108 as well as temporary storage of data during data access operations. Although not specifically depicted in FIG. 2, the control module 104 may include additional functionality as well, including encryption, error detection and correction, and other signal processing capabilities.

The memory module 106 is shown to include a read/write/erase (R/W/E) circuit 114 and one or more flash memory arrays 116. The R/W/E circuitry 114 operates to perform read, write and erasure functions upon the flash memory arrays 116 responsive to control inputs from the control module 104. While the memory utilizes flash memory, such is merely exemplary and not limiting.

The flash memory arrays 116 may be formed of individual flash memory cells 118, as generally depicted in FIG. 3. The flash memory cell 118 is formed on a semiconductor substrate 120 having spaced apart n+ doped regions 122. A gate structure 124 spans the pair of adjacent doped regions so that the flash cell takes a general nMOS transistor configuration. Additional flash cells can be formed on the substrate so that each adjacent pair of the doped regions 122 is provided with an associated gate structure 124.

The gate structure 124 provides an alternating stack of electrically conductive gates 126, 128 and electrically insulative regions 130, 132. Data are stored by each cell 118 in relation to the relative amount of electrical charge stored on the lower gate 126, which is characterized as a floating gate (FG).

The floating gate 126 accumulates charge during a programming operation by the selected application of appropriate voltages to the adjacent doped (drain and source) regions 122 and the upper gate 128, which is characterized as a control gate (CG). These applied voltages induce the controlled migration of electrical charge from a channel (CH) portion of the semiconductor substrate 120 to the floating gate 126 across insulative region 130.

In an initial erased state, there will usually be substantially no accumulated charge on the floating gate. In this state, the cell will generally tend to exhibit drain-source conductivity across the channel without the application of voltage to the control gate. Once charge has been accumulated on the floating gate, the drain-source path will be non-conductive unless a sufficiently high gate control voltage is applied to the control gate, at which point the cell becomes conductive. The programmed state of the cell can be determined by observing the level of control gate voltage required to allow drain-source current to pass through the cell, which generally correlates to the amount of accumulated charge on the floating gate.

The cell 118 can be configured as a single-level cell (SLC) or a multi-level cell (MLC). An SLC stores a single bit; a normal convention is to assign the logical bit value of 1 to an erased cell (substantially no accumulated charge) and a logical bit value of 0 to a programmed cell (presence of a selected threshold of accumulated charge). An MLC stores multiple bits, such as two bits. Generally, n bits can be stored using $2^n$ storage states. A normal convention is to assign the multi-bit logical value 11 to an erased cell with charge C0 (substantially no accumulated charge), and then sequentially assign the remaining multi-bit logical values 01, 00 and 10 to increasingly higher charge levels C1, C2 and C3.

A special erasure operation is generally required to remove accumulated charge from the floating gate 126. An erasure can be carried by the application of a relatively high voltage to the control gate to cause migration of the charge from the floating gate back to the channel. A different set of voltages may be applied to the cell to thereafter add charge to the floating gate during a data write operation.

Memory cells such as 118 in FIG. 3 can be arranged in the memory module 106 as an array of rows and columns of memory cells, as generally depicted in FIG. 4. Each column of adjacent cells can be coupled via one or more bit lines (BL) 134. The control gates 128 of the cells 118 along each row can be interconnected via individual word lines (WL) 136.

Figure 6:
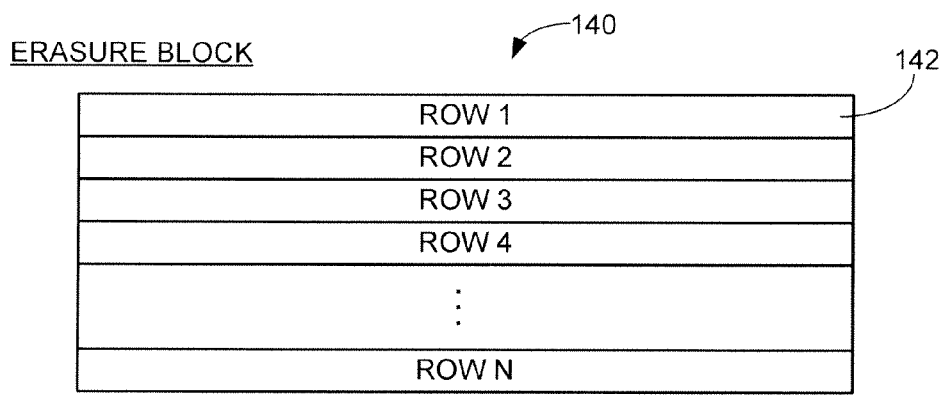
FIG. 6 shows an illustrative arrangement of one of the erasure blocks of FIG. 5.

The array of memory cells shown in FIG. 4 may be grouped into erasure blocks 140, as depicted in FIGS. 5 and 6. Each erasure block 140 may be a separately addressable block of memory and represents the smallest unit of memory that can be concurrent erased at a time. Each erasure block 140 may be arranged as a plurality of rows 142 of memory cells, with each row sharing a common word line (FIG. 4) and accommodating the storage of a selected amount of user data. Other internal arrangements and interconnections of cells can be utilized as desired.

Block-level wear leveling may be employed to track the erase and write status of the various blocks 140. New blocks will be allocated for use as required to accommodate newly received data. In some embodiments, groups of blocks 140 may be accumulated into larger garbage collection units (GCUs) 144 which are allocated, used and erased as a unit. GCUs 144 may take any suitable size.

In at least some embodiments, a fixed size set of data, sometimes referred to as a page, is written to each row 142 at a time. The page size may correspond to a logical sector, or multiple user sectors may be incorporated into each page's worth of data. The sectors may each have an associated logical address, such as a logical block address (LBA). Error correction codes such as parity bits or Reed Solomon codes may be incorporated at the page level to correct errors as a full page worth of data is retrieved. Metadata and other control information may be stored in each erasure block 140, or stored elsewhere such as in specific blocks dedicated to this purpose.

Figure 7:
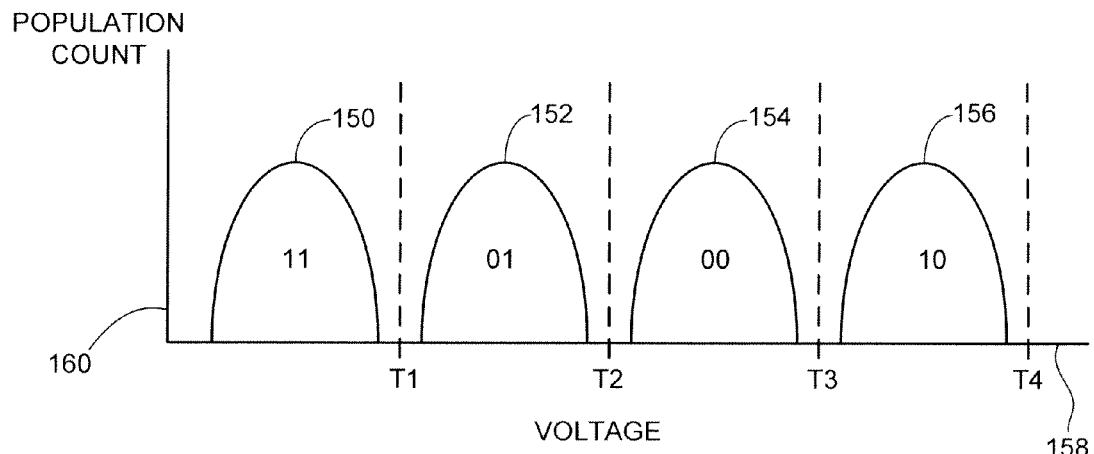
FIG. 7 shows different distributions of charge that may be stored in populations of memory cells in the array of FIG. 5.

FIG. 7 illustrates exemplary normalized charge distributions 150, 152, 154 and 156 for different levels of charge stored on the various flash memory cells 118 in the array of FIG. 5. The distributions are plotted against a common x-axis 158 indicative of voltage magnitude and a common y-axis 160 indicative of cell population count.

The distributions 150, 152, 154 and 156 represent variations about nominal accumulated charge states C0<C1<C2<C3, and correspond to MLC programmed states 11, 01, 00 and 10. Other encoding schemes can be used. Distribution 150 represents variation in the amount of charge on the memory cells in the array that have been programmed to the state 11, distribution 152 corresponds to state 01, distribution 154 corresponds to state 00, and distribution 156 corresponds to state 10. The cells in population 156 have the most accumulated charge and the cells in population 150 have the least accumulated charge.

The programmed states 11, 01, 00 and 10 may represent data for two different pages (blocks) of data in each cell. In this case, the least significant bit (LSB) of the programmed state may provide a bit value for a first page, and the most significant bit (MSB) of the programmed state may provide a bit value for a second page.

The respective charge distributions 150-156 are ideally non-overlapping to allow the application of suitable read-threshold voltages T1, T2, T3 and T4 to differentiate between the various programmed states. Threshold T1 nominally provides a voltage level sufficient to place all of the memory cells in distribution 150 into a source-drain conductive state, but insufficient to place the cells in distributions 152, 154 and 156 into a conductive state. The threshold T4 is generally large enough to place all of the cells in a conductive state irrespective of their programmed state.

The programmed state of a selected flash memory cell can be read by placing the bit line 134 (FIG. 4) for the selected cell at a suitable forward voltage (e.g., +3V, etc.), and placing the remaining non-selected bit lines at some other lower reference voltage (e.g., 0V). The non-selected word lines 136 for rows not containing the selected cell can be placed at the highest threshold T4, so that all of the cells in the selected column other than the selected cell are placed in a source-drain conductive state.

One or more read-threshold voltages can be thereafter applied to the WL 136 associated with the selected cell, and the programmed state of the selected cell can be determined in relation to whether current flows through the bit line 134 and the other cells in the selected column. The read operation thus assesses whether a given read-threshold voltage is sufficient to place the selected cell in a conductive state; the higher the applied voltage required to obtain current flow through the column, the higher amount of accumulated charge is present on the floating gate.

In some embodiments, a first page of data is written to the cells along a selected row of cells in SLC mode. The first page of data will constitute a bit sequence of logical 0s and 1s in some order (e.g., 00101111010000100 . . . ). One bit will be stored in each cell. Those cells in which a logical 1 is to be stored may receive no programming effort (or minimal programming effort) so as to have a charge level that falls within the "11" distribution 150. Those cells in which a logical 0 is to be stored will receive sufficient programming effort to raise the charge level to fall within the "00" distribution 154.

To read back the stored bit sequence from the SLCs, the read threshold voltage T2 can be applied to each cell in turn, and the stored state (logical 1 or 0) can be determined in relation to whether the cell is placed into a conductive state as a result of the applied read threshold voltage.

A second page of data may be subsequently overwritten to the SLC cells to convert the cells into MLC form. As before, the second page of data will constitute a bit sequence of logical 0s and 1s, and one bit from the second page of data will be stored to each cell. Those cells to which a logical 1 is to be stored will receive no additional programmed effort. Those cells to which a logical 0 is to be stored will receive sufficient additional charge to increment the charge level to the next higher distribution.

If a logical 1 is to be written to a memory cell programmed in the "11" distribution 150, the additional charge will transition the cell to the "01" distribution 152. Similarly, if a logical 1 is to be written to a memory cell programmed in the "00" distribution 154, the additional charge will transition the cell to the "10" distribution 156. In each case, the LSB of the programmed cell (rightmost bit) indicates the bit value for the first page of data and the MSB of the programmed cell (leftmost bit) indicates the bit value for the second page of data.

Figure 8:
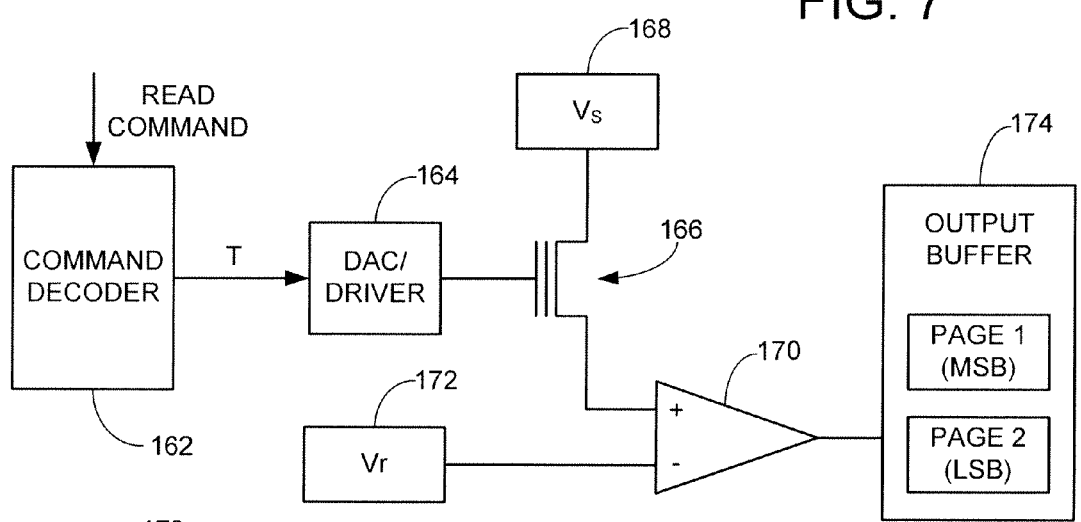
FIG. 8 shows illustrative operation of a portion of the data storage module of FIG. 2 responsive to a read command in accordance with some embodiments.

FIG. 8 illustrates a portion of the read/write/erasure circuitry 114 of FIG. 2 operable to read two pages (blocks) of data from a group of MLCs, such as along a selected row. A command decoder block 162 processes a read command and outputs one or more digital read threshold values T to a digital-to-analog (DAC)/driver circuit 164. The DAC/driver 164 outputs a corresponding analog gate voltage to each cell in turn (represented by a single cell 166). A source voltage V, is applied by source 168. The conductive state of the cell is sensed using a comparator 170 and a suitable reference voltage Vr from source 172. The sensed data are provided to an output buffer 174 which separately stores the stored data (Page 1 and Page 2, respectively).

Multiple thresholds may be required to sense the storage state of each cell. The voltage threshold T2 can be initially applied to sense the storage state of the MSB Page 1 data. The voltage thresholds T1 and T3 may be subsequently applied to sense the storage state of the LSB Page 2 data. If the threshold T2 rendered the cell conductive, T1 may be subsequently applied to determine whether the cell falls within populations 150 or 152. Similarly, if the threshold T2 failed to place the cell in a conductive state, application of T3 will determine whether the cell falls within populations 154 or 156.

The storage state 11, 01, 00 or 10 can thus be easily determined, with the first (MSB) bit indicating a bit in the first page and the second (LSB) bit indicating a bit in the second page. Repeating the above steps for each MLC in turn will produce the recovered bit sequences for the first and second pages.

Figure 9:
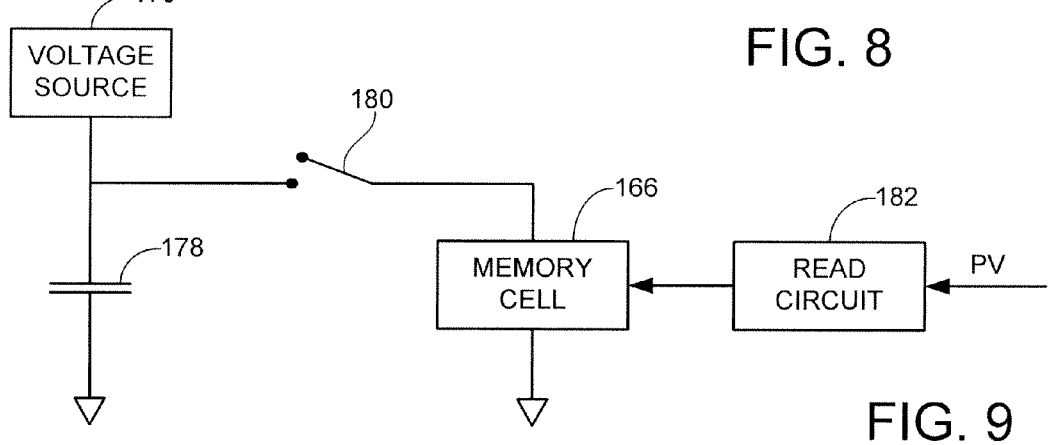
FIG. 9 depicts further portions of the data storage module of FIG. 2 responsive to a write command in accordance with some embodiments.

Programming of the cells can be carried out as set forth by FIG. 9, which illustrates further aspects of the read/write/erasure circuitry 114 in accordance with some embodiments. A charge pump arrangement can be used whereby discrete quanta of accumulated charge are sequentially transferred to the selected cell 166 to raise the total accumulated amount of charge to the desired programming distribution in FIG. 7.

A voltage source 176 supplies a programming voltage to a capacitor 178 or other charge storage element. A selectively activated switch 180, which may take the form of a power MOSFET or other suitable device, periodically closes to allow the transfer of the accumulated charge from the capacitor 178 to the selected memory cell 166.

A read circuit 182, which may have a form that generally corresponds to the read circuitry presented above in FIG. 8, is used to periodically apply one of several program verify (PV) read threshold voltages to the cell during the accumulation of charge. In some embodiments, the program processing of FIG. 9 continues until the cell 166 no longer becomes conductive responsive to the specified PV read threshold value, at which point the programming operation on the selected cell is terminated.

Figure 10:
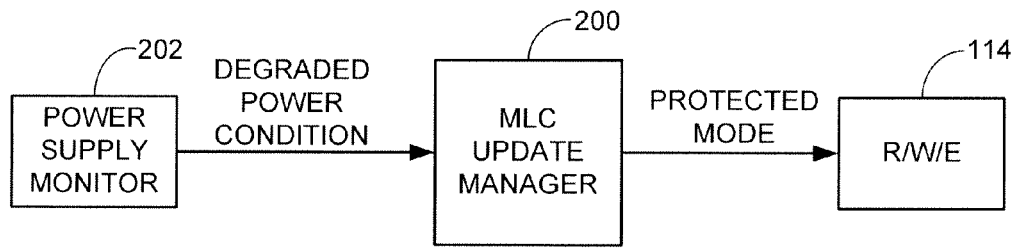
FIG. 10 depicts a multi-bit cell (MLC) update manager operative in accordance with some embodiments.

FIG. 10 illustrates a multi-level cell (MLC) update manager 200 which is configured in accordance with various embodiments to direct operation of the read/write/erasure circuit 114 during MLC update operations. As explained below, a power supply monitor 202 associated with the device 100 detects a degraded power condition, such as a drop in rail voltage or other variation indicating the presence of an anomalous condition. In response, the MLC update manager 200 enters a protected mode which results in the generation of backup copies of previously stored data so that the data are not corrupted during an MLC update operation. The update manager further initiates read-verify operations so that, should an error occur during the MLC update operation, the data blocks can be safely stored in a new memory location.

The power supply monitor 202 can operate in a variety of ways. In cases where the device is supplied with a backup power source, such as a large standby capacitor ("supercap"), indications such as drop in voltage or charge retention may trigger a degraded power condition. Other conditions may include loss of primary power (e.g., a power down condition so that the device moves to save data prior to loss of all power), voltage line transients, degradations of supply power levels, etc.

While various embodiments involve the MLC update manager 200 operating to initiate protected mode processing responsive to the detection of degraded power conditions, such is merely exemplary and not limiting. The manager can alternatively be configured to enter protected mode based on other parameters, including data aging, read counts, write/erasure counts, error rate performance, read disturb effects, and other parametric measurements associated with a particular GCU, erasure block or other physical memory location. The manager may also enter protected mode to provide enhanced protection for higher priority status data, etc.

Figure 11:
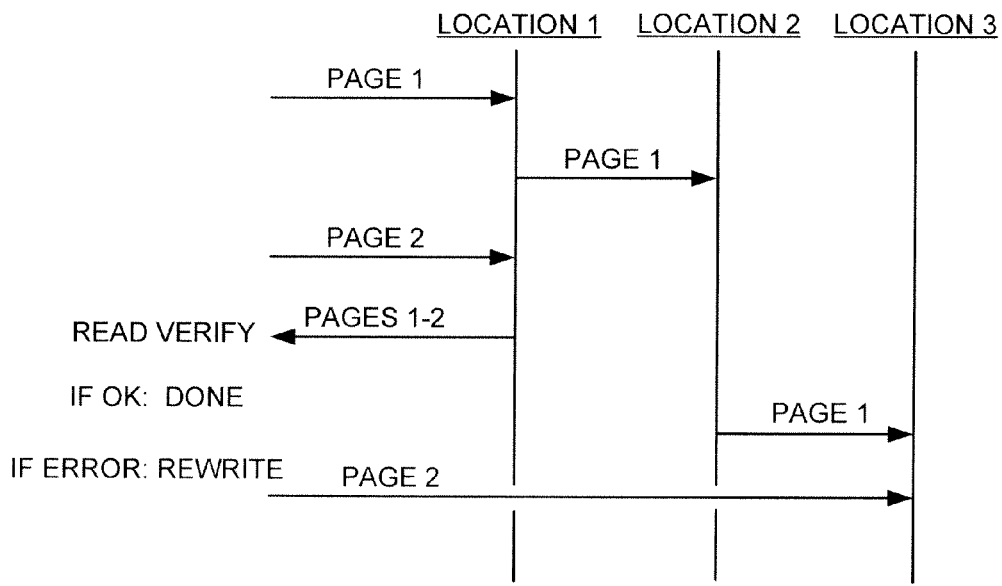
FIG. 11 is a timing diagram illustrating operation of the MLC update manager of FIG. 10 in accordance with some embodiments.

FIG. 11 provides a timing diagram to illustrate an exemplary sequence that may be carried out while the device operates in protected mode. A first block of data (Page 1) is initially stored in a first memory location ("Location 1"), which may constitute a selected row of memory cells in a first erasure block. It is contemplated that the data will be stored in SLC mode so that the Page 1 data are stored in the cells with charge distributions that correspond to either distribution 150 ("11") or distribution 154 ("00") in FIG. 7. The data may be written using the circuitry of FIG. 9 as discussed above.

A second block of data (Page 2) is subsequently presented for storage to the memory cells in the first location. This triggers the generation of a backup copy of the Page 1 data, which involves reading the Page 1 data using circuitry such as set forth in FIG. 8 to temporarily buffer the readback data, followed by writing the buffered data to a second memory location ("Location 2"). The second memory location may be a selected row in a different second erasure block not located in a GCU containing the first erasure block.

The Page 2 data are then stored to the first memory location by overwriting the memory cells along the row to place the cells in MLC format. The final data state of the cells will thus be represented by the respective distributions 150-156 in FIG. 7, with the MSB indicating the Page 1 data and the LSB indicating the Page 2 data.

In some embodiments, the MLC update manager 200 directs a read verify operation upon the first memory location in an attempt to recover the respective Page 1 and Page 2 data. If successful, no further operations are performed. If one or more errors are encountered during the readback, depending on the severity of the error the Page 1 data from the second location, and the input Page 2 data, are written to a third location ("Location 3"), such as a selected row in a third erasure block, or the next available row in the first erasure block.

It is contemplated that error detection and correction (EDC) codes will be incorporated into the data to allow up to a selected number of bit errors to be detected and corrected during the reading of the data. The presence of a small number of correctable read errors may not necessarily require the transfer of the data to the third location. However, due to the detected power degraded situation, in other embodiments the detection of any read errors during the read verify operation may be sufficient to trigger rewriting of the data to the third location.

Other steps may be incorporated into the read verify operation as desired. For example, different read threshold voltages may be applied, including small delta values (e.g., T2+/−10%, etc.) to assess the extent to which the various charge states of the MLCs deviate from normal levels. The decision to maintain the existing MLC data or transfer the data to a new location may be made accordingly.

Figure 12:
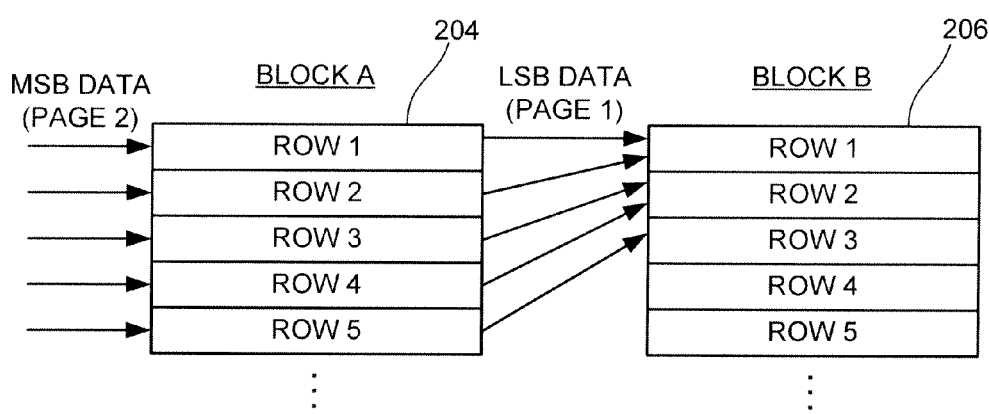
FIG. 12 shows data management operations carried out by the MLC update manager.

FIG. 12 provides a functional block representation of the sequence of FIG. 11. In FIG. 12, various rows in a first erasure block 204 (Block A) correspond to the first location in FIG. 11, and various rows in a second erasure block 206 (Block B) correspond to the second location. Erasure block B is selected as a standby location for erasure block A, and successive LSB (Page 1) data sets are transferred to block B prior to the updating of MSB (Page 2) data sets to block A. The data stored to erasure block B can be in MLC format; that is, a first copy of LSB data for a first row can be written in SLC format and a second copy of the LSB data for a second row can be overwritten in MLC format, provided that the system confirms that the first copy of LSB data is no longer needed prior to the overwriting of the first copy by the second copy.

Figure 13:
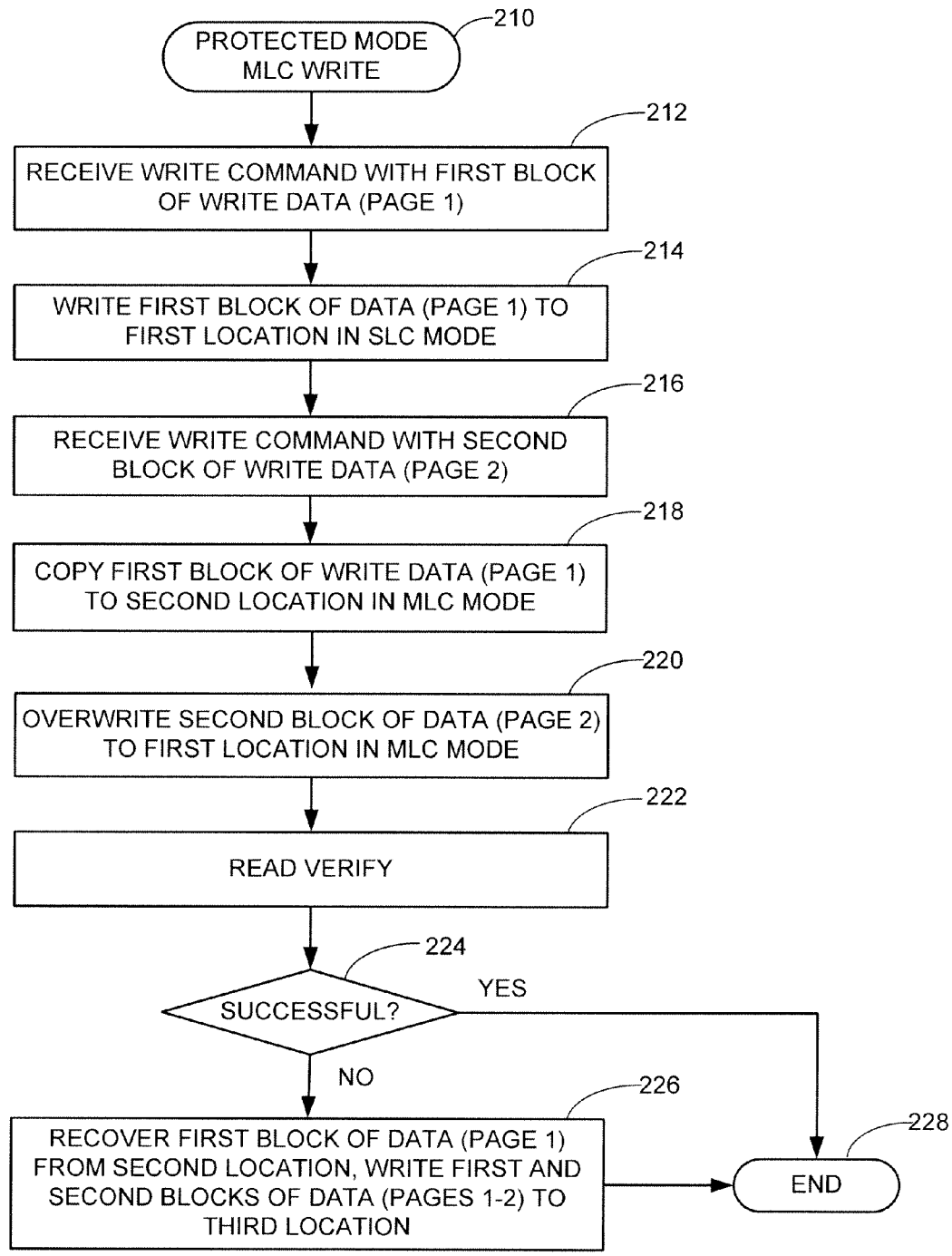
FIG. 13 is a flow chart for a routine illustrative of steps carried out in accordance with various embodiments.

FIG. 13 provides a flow chart for a PROTECTED MODE MLC WRITE routine 210, generally illustrative of various steps carried out in accordance with the foregoing discussion. The steps set forth in FIG. 13 may be altered, omitted and/or carried out in a different order. It will be contemplated that the routine describes operation of the device 100 of FIG. 1 to provide protected mode processing for data stored in the flash memory array 116 of FIG. 2, although such is merely exemplary and not limiting.

During protected mode processing, a write command is received from the host 102 at step 212 to write a first block of write data (Page 1 data) to the main data store of the device 100. The write command may include a logical block address to uniquely identify the data set. The device 100 proceeds at step 214 to identify a target location within the flash memory array 116 to store the data, and writes the Page 1 data to the target location (first memory location) in SLC mode.

The device subsequently receives a second write command from the host 102 at step 216 to write a second block of write data (Page 2 data) to the main data store. As before, the Page 2 data may have an associated logical block address. At step 218, the MLC update manager 200 (FIG. 10) directs the read/write/erasure circuit 114 to copy the Page 1 data to a second memory location. The Page 2 data are thereafter overwritten onto the Page 1 data in the first memory location at step 220, so that both sets of data are stored in MLC mode.

A read verify operation is next performed at step 222, which includes a read operation to recover the respective Page 1 and Page 2 data from the first memory location. In some embodiments, a sufficiently low number of read back errors in the recovered data will be sufficient to verify the overwrite operation. In other embodiments, a data compare operation (such as an XOR operation) can be carried out to verify the data storage operation; the recovered Page 2 data can be compared to an existing copy of the Page 2 data in local buffer memory, and the recovered Page 1 data can be compared to a retrieved copy of the Page 1 data from the second memory location.

Should the read verify operation not be successful, as indicated by decision step 224 the flow continues at step 226 where the Page 1 and Page 2 data are stored to a new, third memory location. Other steps may be carried out as well, such as marking the data stored in the first memory location as invalid or stale. The process then ends at step 228.

While various embodiments discussed above generate the backup copy of the first block of data while in the protected mode of operation, in further embodiments the MLC update manager may perform a search for one or more existing backup copies of the first block of data in the memory array, such as by a review of the associated metadata or other control information that indicates the status and contents of the array. Should an existing copy of the first block of data be stored elsewhere, the copying step may be omitted.

It is to be understood that even though numerous characteristics and advantages of various embodiments of the present disclosure have been set forth in the foregoing description, together with details of the structure and function of various embodiments, this detailed description is illustrative only, and changes may be made in detail, especially in matters of structure and arrangements of parts within the principles of the present disclosure to the full extent indicated by the broad general meaning of the terms in which the appended claims are expressed.

What is claimed is:

1. A method comprising:
   writing a first block of data to a group of memory cells at a first memory location in single-level cell (SLC) mode;
   copying the first block of data to a group of memory cells at a second memory location to provide a backup copy of the first block of data responsive to initiation of a protected mode of operation; and
   overwriting a second block of data to the group of memory cells at the first memory location so that the first memory location stores both the first and second blocks of data in multi-level cell (MLC) mode.

2. The method of claim 1, in which the copying step is carried out responsive to an MLC update manager which initiates the protected mode of operation in response to a detected anomalous power condition.

3. The method of claim 1, further comprising detecting a variable parameter associated with the first memory location, and initiating the protected mode of operation responsive to the detected variable parameter.

4. The method of claim 1, further comprising subsequently performing a read verify operation upon the first memory location in an attempt to successfully retrieve the first and second blocks of data therefrom.

5. The method of claim 4, further comprising storing the first and second blocks of data to a group of memory cells at a third memory location responsive to the unsuccessful retrieval of the first and second blocks of data during the read verify operation.

6. The method of claim 4, in which the read verify operation comprises retrieving the backup copy of the first set of data from the second memory location and comparing said retrieved backup copy to a copy of the first set of data retrieved from the first memory location.

7. The method of claim 1, in which the respective groups of memory cells in the first and second memory locations comprise flash memory cells in a flash memory array.

8. The method of claim 1, in which the first memory location is a row of flash memory cells in a first erasure block and the second memory location is a row of flash memory cells in a second erasure block.

9. The method of claim 1, in which the second memory location stores the backup copy of the first block of data in MLC mode.

10. The method of claim 1, further comprising searching for an existing backup copy of the first set of data in a non-volatile memory array which incorporates the first and second memory locations as portions of said array, and performing the copying step responsive to a determination that said existing backup copy is not present in the array.

11. An apparatus comprising a non-volatile memory array formed of memory cells, and a control circuit adapted to write a first block of data to a group of memory cells at a first memory location in the array in single-level cell (SLC) mode, and responsive to receipt of a second block of data for storage to the array and an initiated protected mode of operation, to copy the first block of data to a group of memory cells at a second memory location in the array to provide a backup copy of the first block of data, and to overwrite a second block of data to the group of memory cells at the first memory location in multi-level cell (MLC) mode so that each memory cell at the first memory location stores at least one bit from each of the first and second blocks of data.

12. The apparatus of claim 11, further comprising an MLC update manager which operates to initiate the protected mode of operation responsive to a detected anomalous power condition.

13. The apparatus of claim 11, in which the control circuit detects a variable parameter associated with the first memory location and stores the backup copy to the second memory location responsive to the detected variable parameter.

14. The apparatus of claim 13, in which the detected variable parameter is at least a selected one of a data aging value, a total accumulated read count, a total number of write/erasure cycles, an error rate or a read disturb value associated with the first memory location.

15. The apparatus of claim 11, in which the memory array is characterized as a flash memory array, the first memory location is a selected row of flash memory cells interconnected to a common word line in a first erasure block, and the second memory location is a selected row of flash memory cells interconnected to a common word line in a different, second erasure block.

16. The apparatus of claim 11, further comprising a power monitoring circuit which monitors a power level utilized by the apparatus, the control circuit generating the backup copy responsive to a detected anomalous condition associated with the monitored power level.

17. The apparatus of claim 1, in which the control circuit is further adapted to perform a read verify operation upon the first memory location in an attempt to successfully retrieve the first and second blocks of data therefrom, and to store the first and second blocks of data to a group of memory cells at a third memory location in the array responsive to the unsuccessful retrieval of the first and second blocks of data during the read verify operation.

18. An apparatus comprising:
   a memory module comprising an array of solid-state memory cells each having an associated address;
   a multi-level cell (MLC) update manager which initiates a protected mode of operation; and
   a control module which operates during said protected mode of operation to write a first block of data to the memory cells at a first memory location in the array in single-level cell (SLC) mode, to copy the first block of data from the first memory location to the memory cells at a second memory location in the array, and to overwrite the memory cells at the first memory location with the second block of data so that the first memory location stores both the first and second blocks of data in MLC mode with each memory cell in the first memory location storing at least one bit from each of the first and second blocks of data.

19. The apparatus of claim 18 further comprising a power monitoring circuit adapted to monitor a power source, wherein the MLC update manager initiates the protected mode of operation responsive to a detected anomalous power condition by the power monitoring circuit.

20. The apparatus of claim 18, in which the array is characterized as a flash memory array, the first memory location comprises a row of flash memory cells in a first erasure block of the array, the second memory location comprises a row of flash memory cells in a second erasure block of the array, and the copy of the first block of data in the second memory location is overwritten onto an existing set of copied data so that the second memory location stores data in MLC mode.

* * * * *